United States Patent [19]
Kozasa

[11] Patent Number: 5,357,140
[45] Date of Patent: Oct. 18, 1994

[54] SEMICONDUCTOR DEVICE CAPABLE OF LAMINATING A PLURALITY OF WIRING LAYERS WHICH ARE MORE THAN FOUR LAYERS

[75] Inventor: Yasuhiko Kozasa, Tokyo, Japan

[73] Assignee: NEC Corporation, Tokyo, Japan

[21] Appl. No.: 115,027

[22] Filed: Sep. 2, 1993

[30] Foreign Application Priority Data

Sep. 2, 1992 [JP] Japan .......................... 4-234594

[51] Int. Cl.$^5$ .................. H01L 23/48; H01L 29/40
[52] U.S. Cl. .......................... 257/752; 257/775; 257/758
[58] Field of Search ............ 257/536, 750, 752, 758, 257/773, 774, 775

[56] References Cited
U.S. PATENT DOCUMENTS

4,484,212 11/1984 Komatsu et al. .................. 257/536

FOREIGN PATENT DOCUMENTS

60-119749 6/1985 Japan .......................... 257/752
63-240045 10/1988 Japan .......................... 257/752

*Primary Examiner*—Jerome Jackson
*Assistant Examiner*—Donald L. Monin, Jr.
*Attorney, Agent, or Firm*—Burns, Doane, Swecker & Mathis

[57] ABSTRACT

In a semiconductor device comprising a plurality of wiring layers which are laminated on a silicon substrate, at least one of the plurality of wiring layers comprises an insulator layer, circuit patterns formed on the insulator layer, and a plurality of rectangular dummy patterns formed on a vacant area of the insulator layer. The plurality of rectangular dummy patterns are arranged so that two adjacent ones of the plurality of rectangular dummy patterns are arranged zigzag along a one direction and that extended lines of a pair of short sides of each of the plurality of rectangular dummy patterns orthogonally cross a pair of long sides of an adjacent one that is adjacent to the each of the plurality of rectangular dummy patterns.

5 Claims, 3 Drawing Sheets

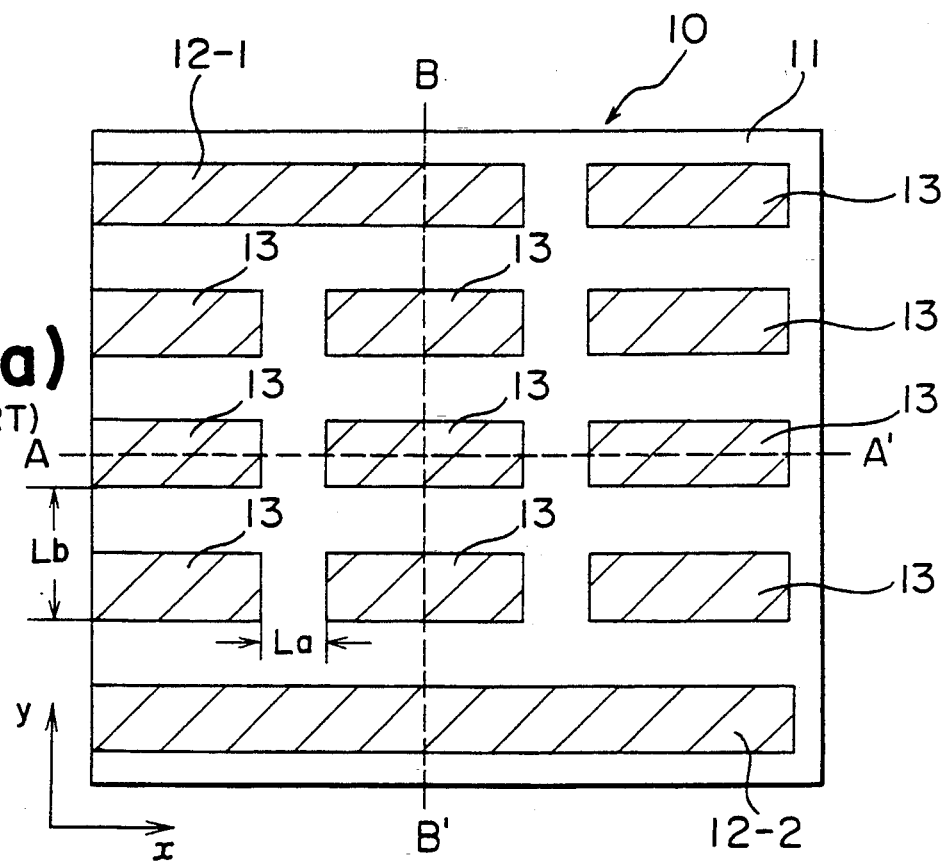
FIG. I(a) (PRIOR ART)
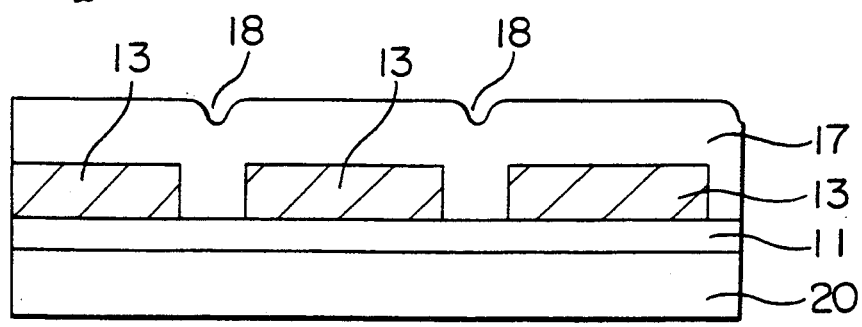
FIG. I(b) (PRIOR ART)
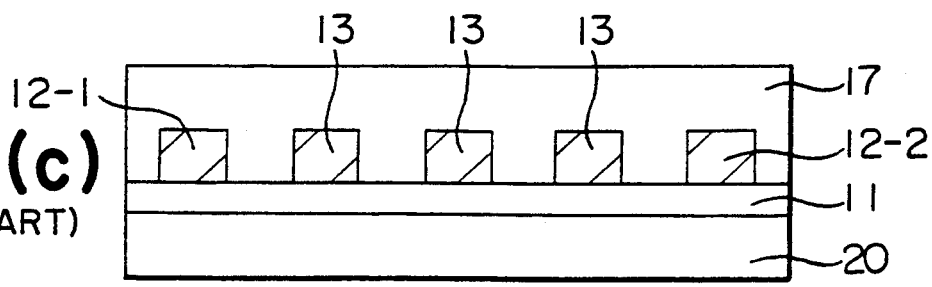
FIG. I(c) (PRIOR ART)

SEMICONDUCTOR DEVICE CAPABLE OF LAMINATING A PLURALITY OF WIRING LAYERS WHICH ARE MORE THAN FOUR LAYERS

BACKGROUND OF THE INVENTION

This invention relates to a semiconductor device comprising a plurality of wiring layers which are laminated on a silicon substrate. Such a semiconductor device is particularly useful in an LSI (large-scale integrated circuit).

In manufacture of a semiconductor device suitable for an LSI, it is required to laminate wiring layers on a silicon substrate as many as possible. Let first through third wiring layers be laminated on the silicon substrate. The first wiring layer comprises a first insulator layer formed on the silicon substrate, circuit patterns formed on the first insulator layer by conductive material. The second wiring layer comprises a second insulator layer, circuit patterns formed on the second insulator layer. Similarly, the third wiring layer comprises a third insulator layer, circuit patterns formed on the third insulator layer. The second insulator layer is formed on the first wiring layer so as to cover an upper surface of the first insulator layer and the circuit patterns of the first wiring layer. Similarly, the third insulator layer is formed on the second wiring layer so as to cover an upper surface of the second insulator layer and the circuit patterns of the second wiring layer. Each of the second and the third insulator layers may be called an interlayer insulator layer. The circuit patterns in the first through the third wiring layers are connected to one another by the use of connection means, such as a through hole, so as to form a required circuit.

With respect to the first wiring layer, the circuit patterns are spaced apart from one another by at least a predetermined pitch Lp and have pattern widths which are not narrower than a predetermined minimum width Lw. In general, the first insulator layer inevitably has a vacant area outside the circuit patterns. Such a vacant area causes a step portion or a hollow portion on an upper surface of the second insulator layer that is formed on the first wiring layer. Such a hollow portion causes degradation of workability for forming the circuit patterns of the second wiring layer or breaking of the circuit patterns of the second wiring layer. This phenomenon applies to the third wiring layer. Such a disadvantage becomes remarkable as the number of wiring layers increases.

In order to get rid of the disadvantage mentioned above, the following manner is well known in the art. For example, a plurality of dummy patterns are formed on the vacant area of the insulator layer in the wiring layer. As an example of the dummy patterns, strip dummy patterns are formed in parallel with the circuit patterns at the intervals of the predetermined pitch Lp. Each of the strip dummy patterns has a large area. This means that wiring capacity caused by the strip dummy patterns becomes large. In this event, if one of the strip dummy patterns are connected to a part of the circuit patterns by mistake, it causes increment of a delay time in the required circuit. As another example of the dummy patterns, square dummy patterns are regularly formed on the vacant area at the intervals of the predetermined pitch Lp. Each of the square dummy patterns has a side equal to the minimum pattern width Lw. In this event, the square dummy patterns are apt to peel from the insulator layer because the side in the square dummy patterns is too short.

Taking the above into consideration, rectangular dummy patterns are regularly formed on the vacant area at intervals of the predetermined pitch Lp. As will later be described in detail, each of the rectangular dummy patterns has a pair of short sides which are equal, in size, to the minimum pattern width Lw. Although the rectangular dummy patterns are superior to the strip dummy patterns and the square dummy patterns, it is hard to perfectly dissolve the problem of the hollow portion mentioned above. For the reason mentioned above, it is hard to realize the semiconductor device comprising a plurality of wiring layers which are more than four layers.

SUMMARY OF THE INVENTION

It is therefore an object of this invention to provide a semiconductor device capable of preventing occurrence of hollow portions.

It is another object of this invention to provide the semiconductor device comprising a plurality of wiring layers which are more than four layers.

Other objects of this invention will become clear as the description proceeds.

On describing the gist of this invention, it is possible to understand that a semiconductor device comprises a silicon substrate and a plurality of wiring layers which are laminated on the silicon substrate. Each of the plurality of wiring layers comprises an insulator layer and circuit patterns formed on the insulator layer. The circuit patterns are spaced apart from one another by at least a predetermined pitch Lp and have pattern widths which are not narrower than a predetermined minimum width Lw. At least one of the plurality of wiring layers further comprises a plurality of rectangular dummy patterns, which have a pair of long sides and a pair of short sides, formed on a vacant area outside the circuit patterns of the insulator layer. Each of the pair of long sides is parallel with one direction while each of the pair of short sides is parallel with another direction orthogonally crossing the one direction.

According to this invention, the plurality of rectangular dummy patterns are arranged so that two adjacent ones of the plurality of rectangular dummy patterns are arranged zigzag along the one direction and that extended lines of the pair of short sides of each of the plurality of rectangular dummy patterns orthogonally cross the pair of long sides of an adjacent one that is adjacent to the each of the plurality of rectangular dummy patterns.

BRIEF DESCRIPTION OF THE DRAWING

FIGS. 1a–1c are illustrations for describing a conventional semiconductor device which comprises conventional dummy patterns;

DESCRIPTION OF THE PREFERRED EMBODIMENT

Figure 2A:
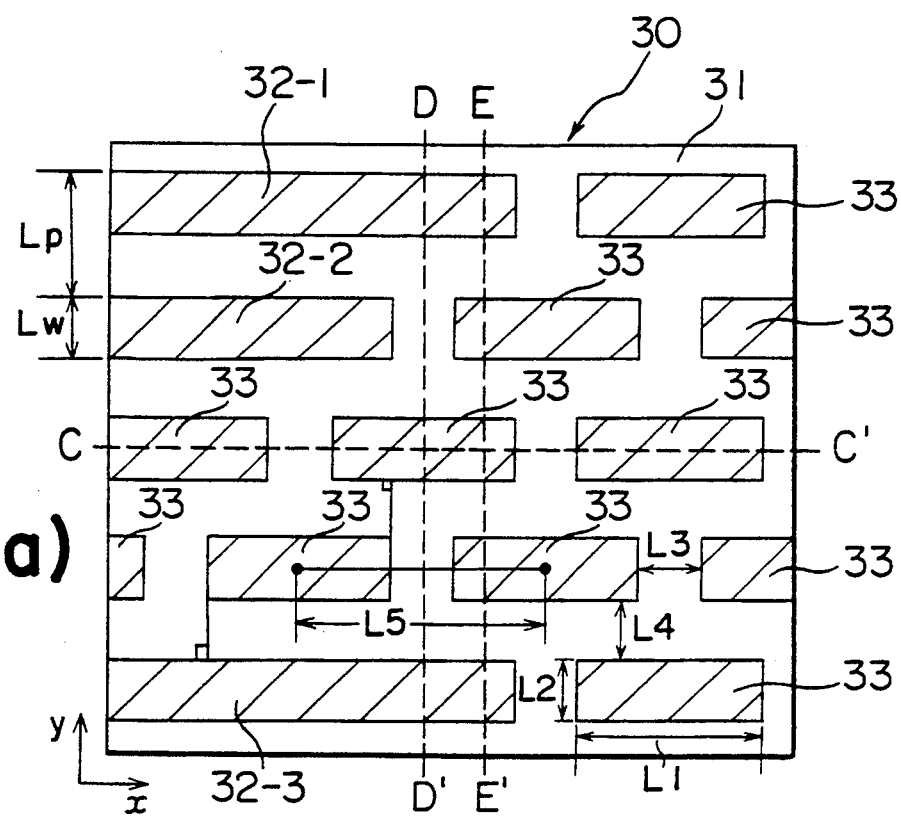
FIGS. 2a–2d are illustrations for describing a semiconductor device according to an embodiment of this invention.

Referring to FIG. 1, a conventional semiconductor device will be described at first in order to facilitate an understanding of this invention.

In FIG. 1(a), the semiconductor device is illustrated with regard to an upper surface of a part of a first, namely, a lowest, wiring layer 10 which comprises a first insulator layer 11, circuit patterns 12-1 and 12-2 formed on the first insulator layer 11, and rectangular dummy patterns 13 formed on the first insulator layer 11. Generally, the semiconductor device comprises the first through a third insulator layers. The rectangular dummy patterns 13 are regularly arranged on a vacant area outside the circuit patterns 12-1 and 12-2. In other words, the rectangular dummy patterns 13 are arranged at regular intervals La and at regular pitches Lb. Namely, the rectangular dummy patterns 13 are lined up in a plurality of lines not only in one direction of an x-axis but also in another direction of a y-axis. In the example, the circuit patterns 12-1 and 12-2 are arranged so as to extend in parallel with the x-axis. In this event, the rectangular dummy patterns 13 are arranged so that a pair of long sides thereof are parallel with the x-axis. A pair of short sides of each of the rectangular dummy patterns 13 are parallel with the y-axis. As a result, a substantially square space is formed between the short sides of two adjacent rectangular dummy patterns 13 that are lined up along the x-axis. On the other hand, a rectangular space is formed between the long sides of two adjacent rectangular dummy patterns 13 that are lined up along the y-axis. In a second wiring layer (not shown), the circuit patterns are formed on a second insulator layer so as to extend in parallel with the y-axis. The rectangular dummy patterns in the second wiring layer are formed so that a pair of long sides thereof are parallel with the y-axis. Although the second insulator layer is not illustrated in FIG. 1(a), it is depicted at 17 in FIGS. 1(b) and 1(c), for convenience of the description, and covers an upper surface of the first insulator layer 11, the circuit patterns 12-1 and 12-2, and the rectangular dummy patterns 13.

In FIGS. 1(b) and 1(c), the first insulator layer 11 is formed on a silicon substrate 20. FIG. 1(b) is a cross-sectional view along a section line A—A' of FIG. 1(a) while FIG. 1(c) shows a cross-sectional view along a section line B—B' of FIG. 1(a). As shown in FIG. 1(b), hollow portions 18 occur in a specific area on an upper surface of the second insulator layer 17. It is to be noted here that the specific area is present at the substantially square space between the short sides of two adjacent rectangular dummy patterns 13. It is presumed that a plurality of substantially square spaces are lined up along a straight line parallel with the y-axis as shown in FIG. 1(a). On the contrary, the hollow portion never occur in the rectangular space between the long sides of two adjacent rectangular dummy patterns 13 as shown in FIG. 1(c).

The hollow portions 18 illustrated in FIG. 1(b) cause degradation of workability of circuit patterns formed on the second insulator layer 17 or breaking of the circuit patterns. Such a disadvantage applies to the second and the third wiring layers.

Referring to FIG. 2, the description will proceed to a semiconductor device according to a preferred embodiment of this invention.

Figure 2B:
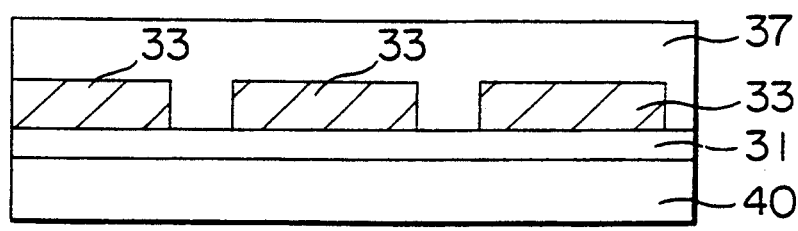

In FIG. 2(b), the semiconductor device is illustrated with regard to an upper surface of a part of a first, namely, a lowest, wiring layer 30 which comprises a first insulator layer 31, circuit patterns 32-1, 32-2, and 32-3 which are formed on the first insulator layer 31, and rectangular dummy patterns 33 formed on a vacant area outside the circuit patterns 32-1, 32-2, and 32-3.

Generally, the circuit patterns 32-1 to 32-3 are spaced apart from one another by at least a predetermined pitch depicted at Lp and have pattern widths which are not narrower than a predetermined minimum width Lw. In the example, all of the circuit patterns 32-1 to 32-3 have the predetermined minimum width Lw. Each of the rectangular dummy patterns 33 has a pair of long sides parallel with the x-axis and a pair of short sides parallel with the y-axis.

As illustrated in FIG. 2(a), the rectangular dummy patterns 33 are arranged so that two adjacent ones of the rectangular dummy patterns 33 are arranged zigzag in a direction along with the x-axis and that extended lines of the pair of short sides orthogonally cross the pair of long sides of adjacent one of the rectangular dummy patterns 33. A first length L1 of each of the pair of long sides of the rectangular dummy patterns 33 is defined by an inequality given by:

$$3Lp + Lw \geq L1 \geq Lp + Lw.$$

A second length L2 of each of the pair of short sides is equal to the minimum pattern width Lw. Furthermore, the rectangular dummy patterns 33 are spaced apart from one another in the one direction along with the x-axis by a third length L3 equal to the minimum pattern width Lw. In the direction along with the y-axis, the rectangular dummy patterns 33 are arranged at intervals of a fourth length L4 equal to the minimum pattern width Lw. A fifth length L5 between two center points of two adjacent ones of rectangular dummy patterns 33 is defined by an equation given by:

$$L5 = L1 + L3.$$

Figure 2C:
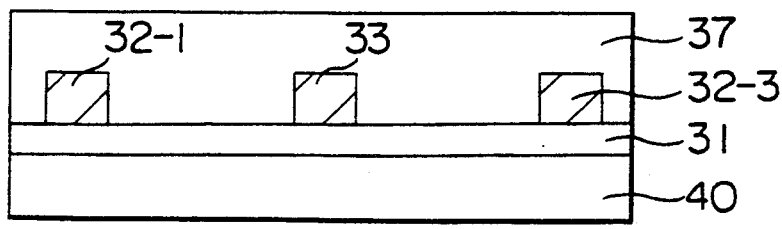
Figure 2D:
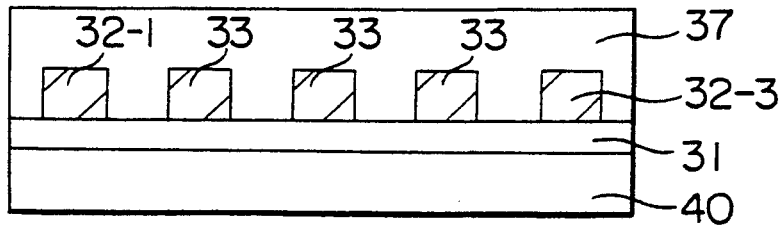

Although the second insulator layer is not illustrated in FIG. 2(a), that is depicted at 37 in FIGS. 2(b) to 2(d) for convenience of the description. FIG. 2(b) is a cross-sectional view along a section line C—C' while FIG. 2(c) is a cross-sectional view along a section line D—D'. Moreover, FIG. 2(d) is a cross-sectional view along a section line E—E'. The second insulator 37 covers an upper surface of the first insulator layer 31, the circuit patterns 32-1 to 32-3, and the rectangular dummy patterns 33. The circuit and the rectangular dummy patterns (not shown) of the second wiring layer are formed on the second insulator layer. The second insulator layer, the circuit, and the rectangular dummy patterns of the second wiring layer are covered by a third insulator layer of the third wiring layer. In addition, since the circuit patterns 32-1 to 32-3 of the first wiring layer extend along with the x-axis, the circuit patterns of the second wiring layer are formed so as to extend along with the y-axis. The fourth wiring layer is formed on the third wiring layer in the manner mentioned above.

According to an arrangement illustrated in FIG. 2(a), a substantially square space is formed between the short sides of two adjacent rectangular dummy patterns 33 that are lined up along the x-axis. However, two adjacent ones of substantially square spaces are arranged zigzag along the y-axis. In other words, a plurality of substantially square spaces never line up along a straight line parallel with the x-axis or the y-axis. As a result of the arrangement, the hollow portions never occur on an upper surface of the second insulator layer 37, as illustrated in FIGS. 2(b) to 2(d). This is because the plurality of substantially square spaces never line up along the straight line parallel with the x-axis or the y-axis.

Although it is desirable that the rectangular dummy patterns illustrated in FIG. 2(a) are formed on all of the wiring layers, the rectangular dummy patterns may be formed every other wiring layer, for example, the first, the third, and a fifth layers. This is because it is possible to get rid of the hollow portions caused by vacant areas of the second and the fourth wiring layers by the rectangular dummy patterns of the first, the third, and the fifth layers. In this event, it is possible to provide the semiconductor device comprising the first through a sixth wiring layers and to reduce the wiring capacity of the wiring layers. If it is possible to form the circuit patterns for power supply lines on a seventh or more layer at a large pitch greater than the predetermined pitch Lp, it is possible to provide the semiconductor device comprising multilevel wiring layers which are more than seven layers. At any rate, it is possible to provide the semiconductor device comprising a plurality of wiring layers which are more than four layers.

Figure 3:
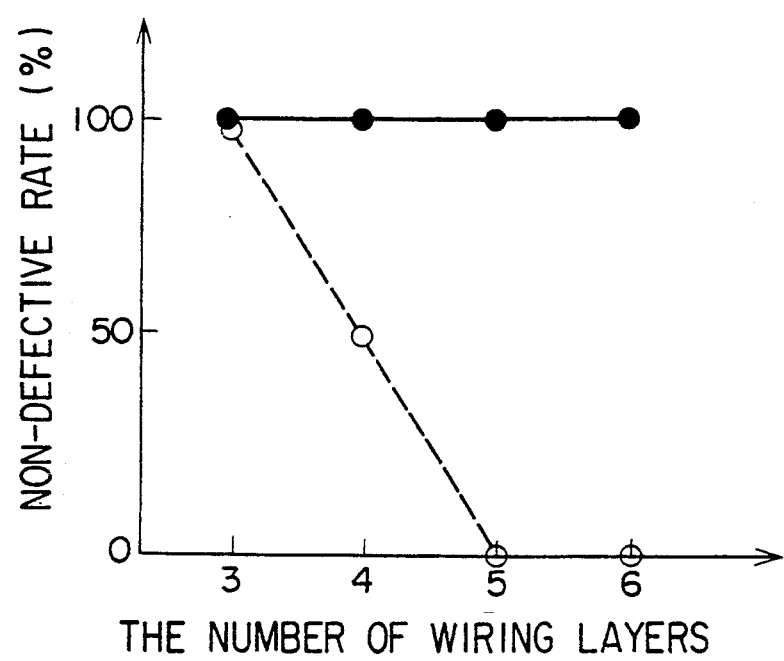
FIG. 3 shows a characteristic for illustrating a non-defective rate versus the number of wiring layers.

Referring to FIG. 3, a non-defective rate of the wiring layer in the conventional semiconductor device is illustrated by a dotted line while a non-defective rate of the wiring layer according to this invention is shown by a real line. In the conventional wiring layer, the non-defective rate of the fourth wiring layer falls to 50% while the non-defective rate of the fifth or more wiring layer drops to 0%. According to this invention, it is possible to obtain the non-defective rate of 100% even in the sixth layer.

While this invention has thus far been described in conjunction with a preferred embodiment thereof, it will readily be possible for those skilled in the art to put this invention into practice in various other manners.

What is claimed is:

1. A semiconductor device comprising a silicon substrate and a plurality of wiring layers which are laminated on said silicon substrate, each of said plurality of wiring layers comprising an insulator layer and circuit patterns formed on said insulator layer, said circuit patterns being spaced apart from one another by at least a predetermined pitch Lp and having pattern widths which are not narrower than a predetermined minimum width Lw, at least one of said plurality of wiring layers further comprising a plurality of rectangular dummy patterns, which each have a pair of long sides and a pair of short sides, formed on a vacant area outside said circuit patterns of said insulator layer, each of said pair of long sides being parallel with a first direction, each of said pair of short sides being parallel with a second direction orthogonally crossing said first direction; said plurality of rectangular dummy patterns being staggered such that projections of at least some of the rectangular dummy patterns only partially overlap adjacent rectangular dummy patterns, wherein said short sides of adjacent rectangular dummy patterns do not lie in a line, a first length L1 of each of said pair of long sides in each of said plurality of rectangular dummy patterns being defined by an inequality given by:

$$3Lp+Lw \geq L1 \geq Lp+Lw.$$

2. A semiconductor device as claimed in claim 1, wherein a second length L2 of each of said pair of short sides is equal to said minimum pattern width Lw.

3. A semiconductor device as claimed in claim 2, wherein said plurality of rectangular dummy patterns are spaced apart from one another along said one direction by a distance equal to said minimum pattern width Lw.

4. A semiconductor device as claimed in claim 3, wherein said plurality of rectangular dummy patterns are formed on every other wiring layer of said plurality of wiring layers.

5. A semiconductor device comprising:
a substrate;
a plurality of wiring layers laminated on said substrate each including an insulator layer and at least two circuit patterns formed on said insulator layers;
wherein said at least two circuit patterns are spaced apart by at least a pitch Lp and have widths not narrower than Lw;
at least one of said plurality of wiring layers also including a plurality of rectangular dummy patterns each having a length L1 arranged in a plurality of substantially parallel rows;
wherein said rectangular dummy patterns in adjacent rows are offset from one another such that a projection of a rectangular dummy pattern in a first row only partially overlaps a rectangular dummy pattern in a second row; and
wherein said length L1 is defined by the inequality:

$$3Lp+Lw \geq L1 \geq Lp+Lw.$$

* * * * *